(12) United States Patent
Kagiwada et al.

(10) Patent No.: US 10,033,150 B2
(45) Date of Patent: Jul. 24, 2018

(54) LASER APPARATUS FOR CALCULATING EFFECTIVE DRIVING TIME

(71) Applicant: FANUC CORPORATION, Yamanashi (JP)

(72) Inventors: Satoshi Kagiwada, Yamanashi (JP); Hiroshi Takigawa, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/491,153

(22) Filed: Apr. 19, 2017

(65) Prior Publication Data

US 2017/0310074 A1 Oct. 26, 2017

(30) Foreign Application Priority Data

Apr. 22, 2016 (JP) ................. 2016-086430

(51) Int. Cl.
| | |
|---|---|
| H01S 3/00 | (2006.01) |
| H01S 5/00 | (2006.01) |
| H01S 5/0683 | (2006.01) |
| H01S 5/22 | (2006.01) |
| H01S 3/10 | (2006.01) |
| G09G 1/00 | (2006.01) |
| H01S 5/40 | (2006.01) |
| G09G 3/02 | (2006.01) |
| H04N 9/31 | (2006.01) |
| H01S 5/042 | (2006.01) |

(52) U.S. Cl.
CPC .......... *H01S 5/0021* (2013.01); *G09G 1/005* (2013.01); *G09G 3/02* (2013.01); *G09G 2360/14* (2013.01); *H01S 3/10* (2013.01); *H01S 5/042* (2013.01); *H01S 5/0683* (2013.01); *H01S 5/2201* (2013.01); *H01S 5/4025* (2013.01); *H04N 9/3194* (2013.01)

(58) Field of Classification Search
CPC .... H01S 3/102; H04N 9/3194; H04N 9/3135; G09G 3/02; G09G 2360/16; G09G 2320/0666; G09G 2360/14
USPC ....................................... 372/38.02
See application file for complete search history.

(56) References Cited

U.S. PATENT DOCUMENTS

| | | | |
|---|---|---|---|
| 6,400,349 B1* | 6/2002 | Nagumo ............ | G06K 15/1247 345/82 |
| 2005/0226293 A1* | 10/2005 | Yeh ...................... | G11B 7/1263 372/38.02 |
| 2015/0180192 A1* | 6/2015 | Tsushima ............. | H01S 3/134 372/29.013 |

FOREIGN PATENT DOCUMENTS

| | | |
|---|---|---|
| EP | 2071568 A1 | 6/2009 |
| JP | 01318274 A | 12/1989 |
| JP | H-08-279642 A | 10/1996 |

(Continued)

*Primary Examiner* — Vu A Vu
(74) *Attorney, Agent, or Firm* — RatnerPrestia

(57) ABSTRACT

Even when a light source is driven under various conditions, an effective driving time is accurately calculated. A laser apparatus includes a light source, a power source which charges driving current to the light source, a control unit for controlling the power source, a first recording unit which calculates a life load rate of the light source and records the same in association with time, and a calculation unit which calculates, as an effective driving time, a time integration of the life load rate between a first time point, at which the laser apparatus is actually driven, and a second time point after the first time point, based on a recording result of the first recording unit.

12 Claims, 7 Drawing Sheets

(56) References Cited

FOREIGN PATENT DOCUMENTS

| | | | |
|---|---|---|---|
| JP | 2000133873 | A | 5/2000 |
| JP | 2005-294493 | A | 10/2005 |
| JP | 2005-317178 | A | 11/2005 |
| JP | 2006-222411 | A | 8/2006 |
| JP | 2010109023 | A | 5/2010 |
| JP | 2011-086496 | A | 4/2011 |
| JP | 2012028412 | A | 2/2012 |
| JP | 5166488 | B | 3/2013 |
| JP | 2015099768 | A | 5/2015 |

* cited by examiner

|  |  | FREQUENCY (kHZ) | | | | |
| --- | --- | --- | --- | --- | --- | --- |
|  |  | 1 | 5 | 10 | 20 | 30 |
| DUTY | 10% | 1.311 | 1.584 | 2.257 | 3.128 | 5.326 |
|  | 20% | 1.227 | 1.368 | 2.032 | 2.846 | 4.957 |
|  | 30% | 1.143 | 1.152 | 1.887 | 2.513 | 4.158 |
|  | 40% | 1.050 | 1.054 | 1.400 | 2.397 | 3.548 |
|  | 50% | 0.956 | 0.956 | 0.913 | 1.912 | 2.763 |
|  | 60% | 0.932 | 0.937 | 0.877 | 1.020 | 2.013 |
|  | 70% | 0.907 | 0.917 | 0.841 | 1.005 | 1.604 |
|  | 80% | 0.885 | 0.906 | 0.859 | 0.943 | 1.206 |
|  | 90% | 0.862 | 0.855 | 0.976 | 0.987 | 1.171 |
|  | 100% | 1.000 | 1.000 | 1.000 | 1.000 | 1.000 |

LASER APPARATUS FOR CALCULATING EFFECTIVE DRIVING TIME

BACKGROUND OF THE INVENTION

1. Field of the Invention

The present invention relates to a laser apparatus including a light source used as a laser light source or an excitation light source for laser oscillation.

2. Description of the Related Art

The laser apparatus includes a light source used as a laser light source or an excitation light source for laser oscillation. Japanese Unexamined Patent Publication (Kokai) No. 8-279642, Japanese Unexamined Patent Publication (Kokai) No. 2005-294493, Japanese Unexamined Patent Publication (Kokai) No. 2005-317178, Japanese Unexamined Patent Publication (Kokai) No. 2006-222411, Japanese Unexamined Patent Publication (Kokai) No. 2011-86496, and Japanese Patent No. 5166488 disclose prediction of the remaining life of a light source of a laser apparatus.

Specifically, Japanese Unexamined Patent Publication (Kokai) No. 8-279642 discloses that the life of a light emitting element is predicted by setting a driving current value for emitting a specific optical output as a reference value and a driving current larger by n times than the reference value as a deterioration threshold value for replacing the light emitting element.

Further, Japanese Unexamined Patent Publication (Kokai) No. 2005-294493 discloses that control is performed so as to keep constant an output of each laser oscillator and set power at the machining point equal to a predetermined power, and the life of the excitation laser diode is predicted.

Further, Japanese Unexamined Patent Publication (Kokai) No. 2005-317178 discloses that the life of the semiconductor laser is predicted based on the time-sequential data relating to the increase of the generated heat amount.

Further, Japanese Unexamined Patent Publication (Kokai) No. 2006-222411 discloses that the life of the excitation light source is estimated by using a value of current supplied from the power source to the excitation light source when a signal output from the power sensor satisfies a predetermined condition, and an operation time stored in the memory.

Further, Japanese Unexamined Patent Publication (Kokai) No. 2011-86496 discloses that a replacement timing of the laser light source is predicted based on a difference between current intensity characteristics, which are made by sampling a plurality of relationships between the current supplied by the power source and the intensity measured by the intensity measuring unit, and ideal current intensity characteristics with respect to the current intensity characteristics.

Further, Japanese Patent No. 5166488 discloses that, when cumulative time, in which the driving current exceeding a current having a predetermined deterioration threshold value flows through the laser diode, exceeds a threshold time preset for every ambient temperature, the life of the laser diode is determined to be nearing its end.

SUMMARY OF THE INVENTION

In terms of guarantee and maintenance, the effective driving time of a laser apparatus is important for a light source which is a main part of the laser apparatus. When only a constant standard driving current is supplied to the light source, the driving time of the laser apparatus can be easily found. However, the laser apparatus is often used on various optical output conditions, i.e., from a low output to a high output and from a continuous laser output to a pulse laser light output. Thus, it is difficult to accurately determine the actual driving time of the laser apparatus.

Further, Japanese Unexamined Patent Publication (Kokai) No. 8-279642, Japanese Unexamined Patent Publication (Kokai) No. 2005-294493, Japanese Unexamined Patent Publication (Kokai) No. 2005-317178, Japanese Unexamined Patent Publication (Kokai) No. 2006-222411, Japanese Unexamined Patent Publication (Kokai) No. 2011-86496, and Japanese Patent No. 5166488 do not disclose calculation of the effective driving time which is applicable when the light source is driven on various optical output conditions, i.e., from a low output to a high output and from a continuous laser output to a pulse laser light output.

Further, in order to obtain a budget in expectation of a replacement timing of the light source, it is preferable to monitor the remaining life of the laser apparatus in the early lifetime before deterioration of the light source. In the late stage of lifetime of the light source, in order to prepare a new light source for replacement, or well-timed replacement of the light source, more accurately monitoring of the remaining life is required.

However, in conventional arts, when a deterioration speed gradually increases, it is difficult to accurately monitor the remaining life. Further, the deterioration speed of the light source varies depending on the laser apparatus, and accordingly, it is more difficult to monitor the remaining life. In Japanese Unexamined Patent Publication (Kokai) No. 2005-317178 and Japanese Unexamined Patent Publication (Kokai) No. 2011-86496, the remaining life cannot be estimated until deterioration appears.

The present invention was made in light of the circumstances described above and has an object to provide a laser apparatus which can always and accurately calculate an effective driving time of the light source even when being used on various optical output conditions, i.e., from a low output to a high output and from a continuous laser output to a pulse laser light output, and can accurately calculate a remaining life of the light source.

To achieve the above object, according to a first aspect of the invention, there is provided a laser apparatus, which includes a light source which functions as a laser light source or an excitation light source, a power source which charges driving current to the light source, to drive the light source, a control unit for controlling the power source, a first recording unit for recording a life load rate of the light source, and a calculation unit which calculates, as an effective driving time, a time integration of the life load rate between a first time point, at which the laser apparatus is actually driven, and a second time point after the first time point, based on a recording result of the first recording unit.

According to a second aspect of the invention, the laser apparatus according to the first aspect of the invention includes a second recording unit which records, as an effective cumulative driving time, a time integration of the life load rate between a starting time point of the use of the light source and the present time point.

According to a third aspect of the invention, in the laser apparatus according to the first aspect of the invention, the life load rate is a ratio between the life of the light source when standard driving current is charged to the light source and the life of the light source when driving current is charged to the light source.

According to a fourth aspect of the invention, in the laser apparatus according to the first aspect of the invention, the life load rate is a function including an exponentiated term of a ratio between standard driving current charged to the light source and driving current charged to the light source.

According to a fifth aspect of the invention, the laser apparatus according to the third aspect of the invention includes a third recording unit which records, when a command value of driving current having a pulse waveform is input, a correction factor using frequency and duty in the pulse waveform as variables, in relation to a ratio between a time integration of the life load rate calculated based on a command value of the driving current and a time integration of the life load rate calculated based on an actual value of the driving current. The calculation unit calculates a time integration of the life load rate between the first time point and the second time point based on a command value of the driving current, and the correction factor.

According to a sixth aspect of the invention, in the laser apparatus according to the fifth aspect of the invention, when the correction factor is larger than a first predetermined value, indication or warning of the fact that a change of command value of the driving current is suggested is output, or a combination of the frequency and the duty is changed so that the correction factor is smaller than the first predetermined value.

According to a seventh aspect of the invention, in the laser apparatus according to the second aspect of the invention, the first recording unit further records, as a lifetime, the life of the light source when standard driving current is charged to the light source, and further calculates a remaining life by subtracting the effective cumulative driving time from the lifetime.

According to an eighth aspect of the invention, the laser apparatus according to the seventh aspect of the invention further includes a fourth recording unit which records a correlation between a first performance index that can be derived from the optical output characteristics of the light source and the lifetime of the light source. The lifetime of the light source is changed based on the correlation recorded in the fourth recording unit.

According to a ninth aspect of the invention, the laser apparatus according to the second aspect of the invention further includes an optical output detection unit for measuring an optical output characteristics of the light source, and a fifth recording unit which records a correlation between a second performance index, which can be derived from the optical output characteristics of the light source after the light source is driven, by only a cumulative driving time, at the standard driving current, and an expected remaining life of the light source. A command from the control unit causes a first estimated remaining life to be estimated based on the second performance index derived from a measurement result obtained by measuring an optical output characteristics of the light source in accordance with a predetermined schedule, an effective cumulative driving time until the light output characteristics is measured, and a record result recorded in the fifth recording unit. When a deviation between the first estimated remaining life and a remaining life obtained by subtracting the effective cumulative driving time from the lifetime of the light source, which is recorded in the first recording unit until the optical output characteristics of the light source is measured, is not less than a second predetermined value, the lifetime is changed so that the deviation is zero or substantially zero.

According to a tenth aspect of the invention, the laser apparatus according to the second aspect of the invention includes an optical output detection unit for measuring an optical output characteristics of the light source, a sixth recording unit which records the optical output characteristics detected by the optical output detection unit in association with time, a seventh recording unit which records an effective driving time between a third time point and a fourth time point after the third time point, calculated by the calculation unit based on a recording result of the sixth recording unit, and an eighth recording unit which records a data table of a deterioration curved line representing the progress of deterioration in association with the driving time regarding a third performance index that can be derived from an optical output characteristics of the light source. A command from the control unit causes a second estimated remaining life to be estimated by checking, when an optical output characteristics of the light source is measured in accordance with a predetermined schedule, a deterioration speed of the third performance index, which is obtained by dividing a deviation between the third performance index at the third time point and the third performance index at the fourth time point by the effective driving time, against the deterioration curved line recorded in the eighth recording unit. After a time point at which the second estimated remaining life is shorter than a predetermined time, or a time point at which a deterioration speed of the third performance index is larger than a third predetermined value, the lifetime of the light source, which is recorded in the first recording unit at the fourth time point, is changed to a sum of the effective cumulative driving time recorded in the second recording unit and the second estimated remaining life.

According to an eleventh aspect of the invention, in the laser apparatus according to the seventh aspect of the invention, when the remaining life, which is obtained by subtracting the effective cumulative driving time from the lifetime, is not greater than a predetermined time, at least one of changing a color of the remaining life displayed on a display unit and blinking the remaining life displayed on the display unit is performed.

According to a twelfth aspect of the invention, the laser apparatus according to the second aspect of the invention includes an optical output detection unit for measuring an optical output characteristics of the light source, and a communication unit which transmits the optical output characteristics, the effective cumulative driving time until the optical output characteristics is measured, and the remaining life when the optical output characteristics is measured, to the outside. A command from the control unit causes the transmission unit to transmit, when an optical output characteristics of the light source is measured in accordance with a predetermined schedule, a measurement result of the optical output characteristics of the light source, the effective driving time until that time point, and the remaining life, to a receiving unit provided at a location remote from the laser apparatus, via the communication unit.

These objects, features, and advantages of the present invention and other objects, features, and advantages will become further clearer from the detailed description of typical embodiments illustrated in the appended drawings.

DETAILED DESCRIPTION

Figure 1:
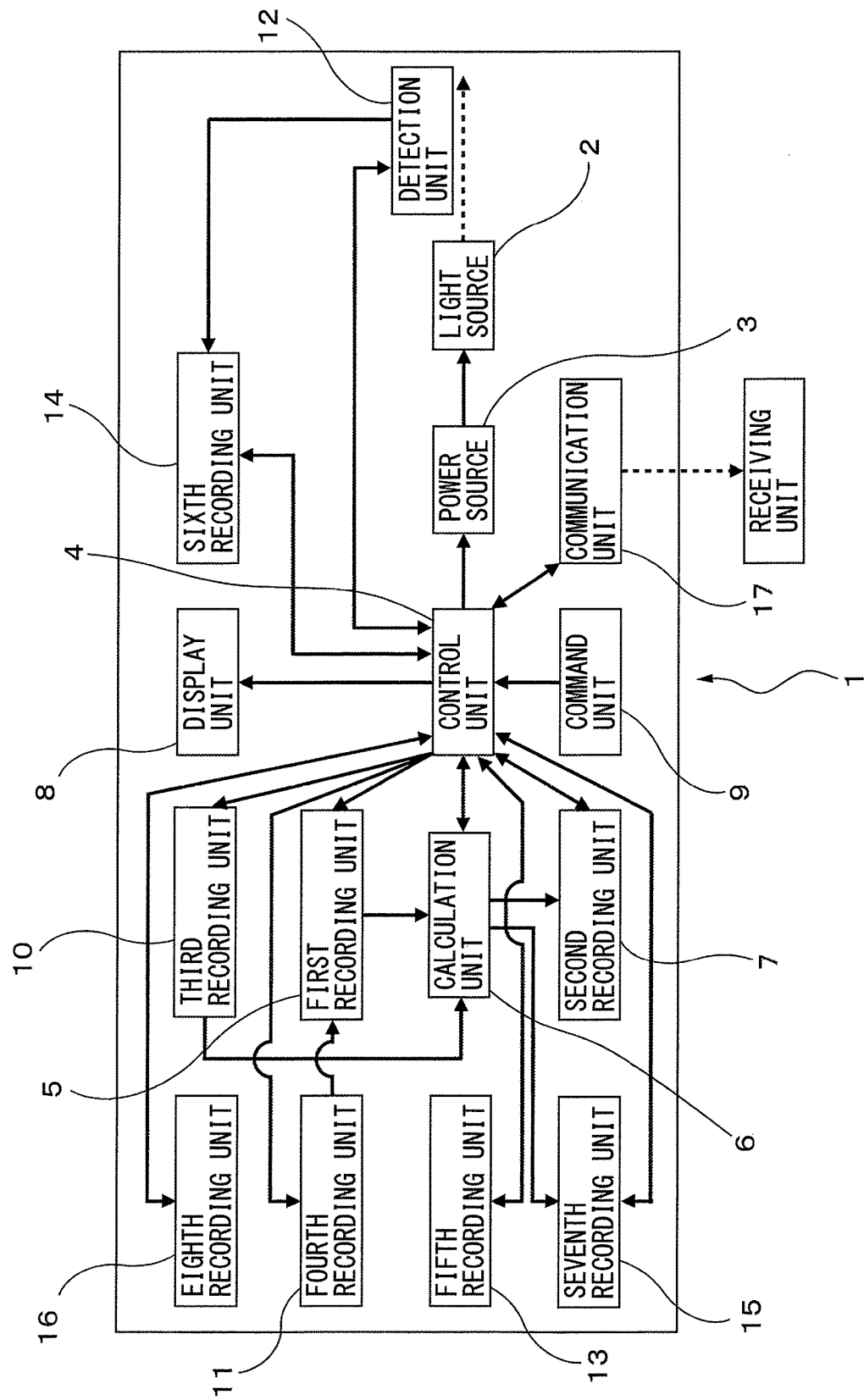
FIG. 1 is a functional block diagram of a laser apparatus based on the present invention.

Embodiments of the present invention will be described below with reference to the accompanying drawings. In the following figures, similar members are designated with the same reference numerals. These figures are properly modified in scale to assist the understanding thereof.

FIG. 1 is a functional block diagram of a laser apparatus based on the present invention. As shown in FIG. 1, a laser apparatus 1 in the present invention includes one or a plurality of light sources 2 functioning as laser light sources or excitation light sources, one or a plurality of power sources 3 for charging driving current to the light sources 2, to drive the light sources 2, a control unit 4 for controlling the power sources 3, and a command unit 9 for inputting, for example, a command value of the driving current.

The laser apparatus 1 also includes a calculation unit 6 for performing various kinds of calculations, a display unit 8 for displaying calculation results from the calculation unit 6 and various kinds of data, an optical output detection unit 12 which can measure the optical output characteristics of the light source 2, and a communication unit 17 which transmits calculation results of the calculation unit 6 and various kinds of data, which are supplied to the control unit 4, to an external receiving unit. Note that the calculation unit 6 may be comprised of a hardware circuit. Further, the optical output detection unit 12 can also detect first to third performance indexes that will be described later.

The laser apparatus 1 also includes a first recording unit 5, a second recording unit 7, a third recording unit 10, a fourth recording unit 11, a fifth recording unit 13, a sixth recording unit 14, a seventh recording unit 15, and an eighth recording unit 16, which are used to record data that will be described later and which will be described later. The first to eighth recording units 5 to 16 may be memories which are physically separated from one another. Alternatively, a plurality of recording units may constitute an integral, single memory. Thus, a single memory may have all functions of the first to eighth recording units 5 to 16.

The first recording unit 5 records a life load rate of the light source 2. The life load rate is, for example, a ratio of the life $\tau(Is)$ of the light source 2 when a standard driving current Is is charged to the light source 2 to the life $\tau(Io)$ of the light source 2 when a driving current Io is charged to the light source 2 $(=\tau(Is)/\tau(Io))$. In this instance, the life load rate can be represented by $k(Io)$. The first recording unit 5 finds, for example, the life load rate $k(Io)$ calculated as described above from experimental data etc., and records the same. The first recording unit 5 also records a lifetime, i.e., the remaining life of the light source 2 from a given time point To. The first recording unit 5 may also record a ratio Io/Is of the driving current Io to the standard driving current Is.

Note that the standard driving current Is is a driving current having a constant value which is ideal for an excellent operation of the light source 2. The driving current Io is a current value used to operate the light source 2, and can vary depending on the time.

Further, the calculation unit 6 calculates a time integration of the life load rate between the first time point Ta, at which the laser apparatus 1 is actually driven, and a second time point Tb after the first time point Ta, as an effective driving time between the first time point Ta and the second time point Tb (refer to the equation below). The effective driving time is recorded in the second recording unit 7.

$$\text{(Effective driving time)} = \int_{Ta}^{Tb} k(Io(t))dt$$

Further, the second recording unit 7 records effective cumulative driving time. The effective cumulative driving time is a time integration of the life load rate from a certain time point To to a given time point Ts after the time point To, and is represented by the equation below.

$$\text{(Effective cumulative driving time)} = \int_{Ta}^{Tb} k(Io(t))dt$$

Note that the first time point Ta and the second time point Tb are preferably set to be between the time point To and the time point Ts.

The certain time point To can be set at any time point. However, the certain time points To of the light sources 2, which are set at different time points, causes failures, such as variation in lifetime. Thus, it is preferable that, for example, a time point, at which the light source 2 is produced and completed as a product that can be delivered after a predetermined burn-in is performed, or a time point thereafter, at which a driving current is initially applied to the laser apparatus 1 to drive the laser apparatus, is set as the certain time point To. In other words, it is preferable that the same time point is set as the certain time point To for each light source 2. For example, the time point To is set as a starting time point, and the time point Ts is set as the present time point.

The second recording unit 7 can record a time integration of the time from the certain time point To to a time point Tp, at which the light source 2 is finally driven, while always updating the time integration as the latest effective cumulative driving time. The latest effective cumulative driving time is represented by the equation below.

$$\text{(Latest effective cumulative driving time)} = \int_{To}^{Tp} k(Io(t))dt$$

Alternatively, the time point Ts may be set for every predetermined effective driving time or the like, to add the time integration to each time point Ts, as an effective cumulative driving time, to the second recording unit 7. This enables, for example, acquisition of transition data of effective cumulative driving time, which changes with time.

Figure 2:
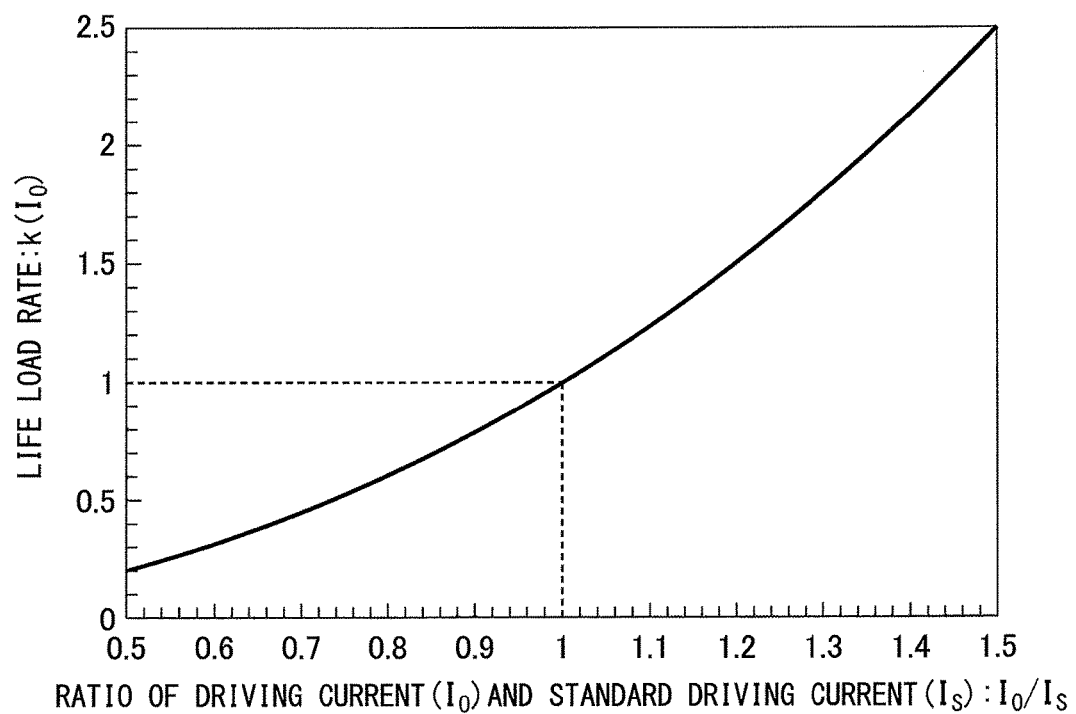
FIG. 2 is a view of the relationship between ratio in driving current and load rate on life.

FIG. 2 is a view of the relationship between ratio in driving current and life load rate. The life load rate is recorded in the first recording unit 5. As shown in FIG. 2, when the ratio Io/Is of the driving current Io to the standard driving current Is is 1, the life load rate k(Io) is 1.

However, when the ratio Io/Is is 1.5, i.e., the driving current is 1.5 times larger than the standard driving current, the life load rate k(Io) is 2.5. In other words, when the driving current is 1.5 times larger than the standard driving current, in comparison with the case that the light source is driven by the standard driving current, the life is consumed at approximately 2.5 times greater speed. Thus, even when the same driving time is taken, the effective driving time increases by 2.5 times.

Note that the actual data recorded in the first recording unit 5 may be data for discrete current. Current value data that are not indicated in the table can be easily calculated by interpolation. The same is true for data recorded in the other recording units.

Alternatively, a function including an exponentiated term of a ratio between the standard driving current charged to the light source 2 and the driving current charged to the light source may be used as a life load rate k(Io). An example is described below.

$$\text{(Life load rate } k(Io)) = \alpha \cdot \left(\frac{Io}{Is}\right)^n + \beta$$

where n is an integer, and α, β are predetermined numbers. These parameters n, α, β are determined for every light source 2. When such a function is used as a life load rate, it is not necessary to set a data table of life load rates based on experimental data, man-hours for making the data table can be reduced.

In the effective, cumulative driving time recorded in the second recording unit 7, the driving time at which the light source 2 is driven by current other than the standard driving current is converted to the driving time when the light source 2 is driven by the standard driving current. Further, the subtraction of the effective cumulative driving time from the lifetime recorded in the first recording unit 5 enables the remaining life of the light source 2 to be calculated.

As described above, in the laser apparatus 1 according to this embodiment, even when the light source 2 is used on current conditions other than the standard driving current, an effective driving time, at which a load (life consumption) similar to that at the driving time when the light source 2 is driven by the standard driving current is given, can be always and accurately calculated. Thus, the remaining life of the light source with respect to the average life, the life consumption rate with respect to the guaranteed life on the standard driving conditions, or the like, can be easily and accurately derived at any time even when the laser apparatus 1 is in use. Consequently, even when the light source is driven on various optical output conditions, i.e., from a low output to a high output and from a continuous laser output to a pulse laser light output, the effective driving time can be accurately calculated.

Figure 3A:
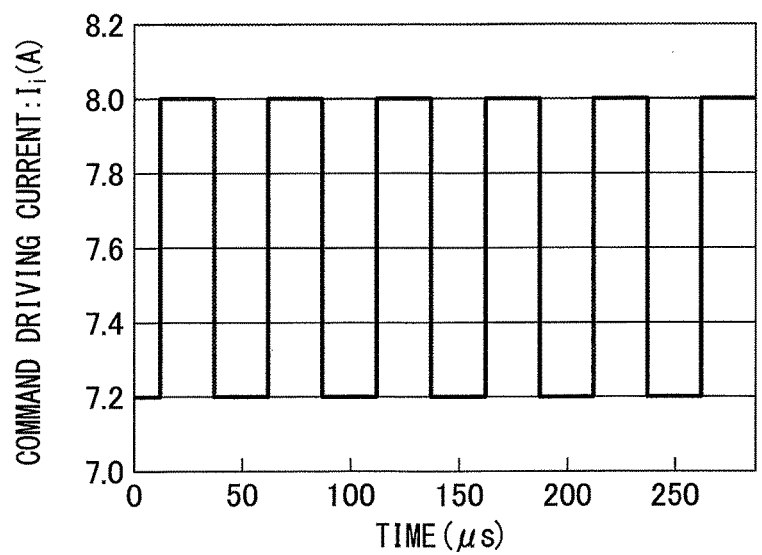
FIG. 3A is a view of the relationship between time and driving current command values.
Figures 3B, 3C:
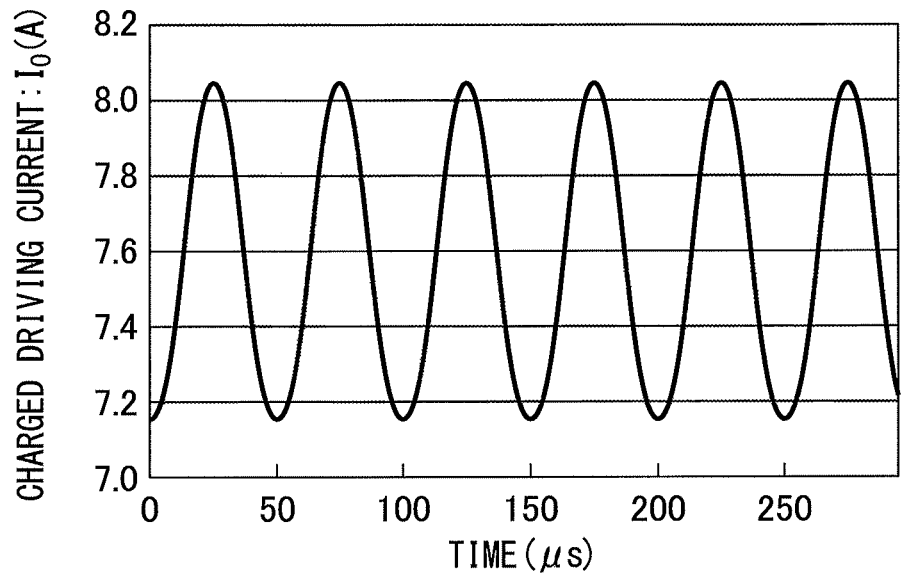
FIG. 3B is a view of the relationship between time and actual driving current values.
FIG. 3C is a view of an example of a map of correction factors.

FIG. 3A is a view of the relationship between time and driving current command values. FIG. 3B is a view of the relationship between time and driving current actual values. As can be seen from FIGS. 3A and 3B, even when a pulse waveform is formed by plotting the driving current command values, a complete pulse waveform is not formed by plotting the driving current actual values. Specifically, when the frequency of the pulse waveform is high, overshoot may occur for driving current command values in some cases.

Thus, a correction factor for correcting differences between driving current actual values Io and driving current command values Ii is previously calculated by, for example, an experiment. A correction factor m(f, d) is a function using, as variables, a frequency f and a duty d of the pulse waveform of driving current command values, and is recorded, as shown in FIG. 3C, in the form of a map (data table) in the third recording unit 10. Note that the correction factor m(f, d) varies depending on the power source 3, and accordingly, different maps of the correction factor are prepared for the respective power sources 3.

In this instance, the effective driving time can be calculated by the equation below.

$$\text{(Effective driving time)} = \int_{Ta}^{Tb} m(f, d) \cdot k(Ii(t)) dt$$

In this equation, it will be understood that the driving current actual values Io are not used.

Thus, the effective driving time can be accurately calculated from driving current command values without measuring the waveform of driving current actual values, which changes at a high speed. Note that the effective cumulative driving time can be calculated in the same manner, and accordingly, the remaining life of the light source 2 can be accurately calculated without measuring driving current actual values.

In the meantime, the data table of correction factors m(f, d) shown in FIG. 3C is an example when low current level/high current level in the pulse current waveform=0.9. Thus, it is necessary to additionally make a data table when low current level/high current level is not 0.9.

Suppose that pulse driving is performed at, for example, a frequency of 10 kHz and a duty of 30%, with reference to the data table of correction factors m(f, d) shown in FIG. 3C. In this instance, the life calculated from driving current actual values is 1.887 times longer than the life calculated from driving current command values. Thus, the effective driving time increases at 1.887 times greater speed.

Note that, in the case of pulse driving at a low frequency and continuous driving at a constant driving current, the difference between driving current command values and driving current actual values is small. Thus, in this instance, any of driving current command values and driving current actual values may be used to calculate, for example, the effective driving time.

Figure 4:
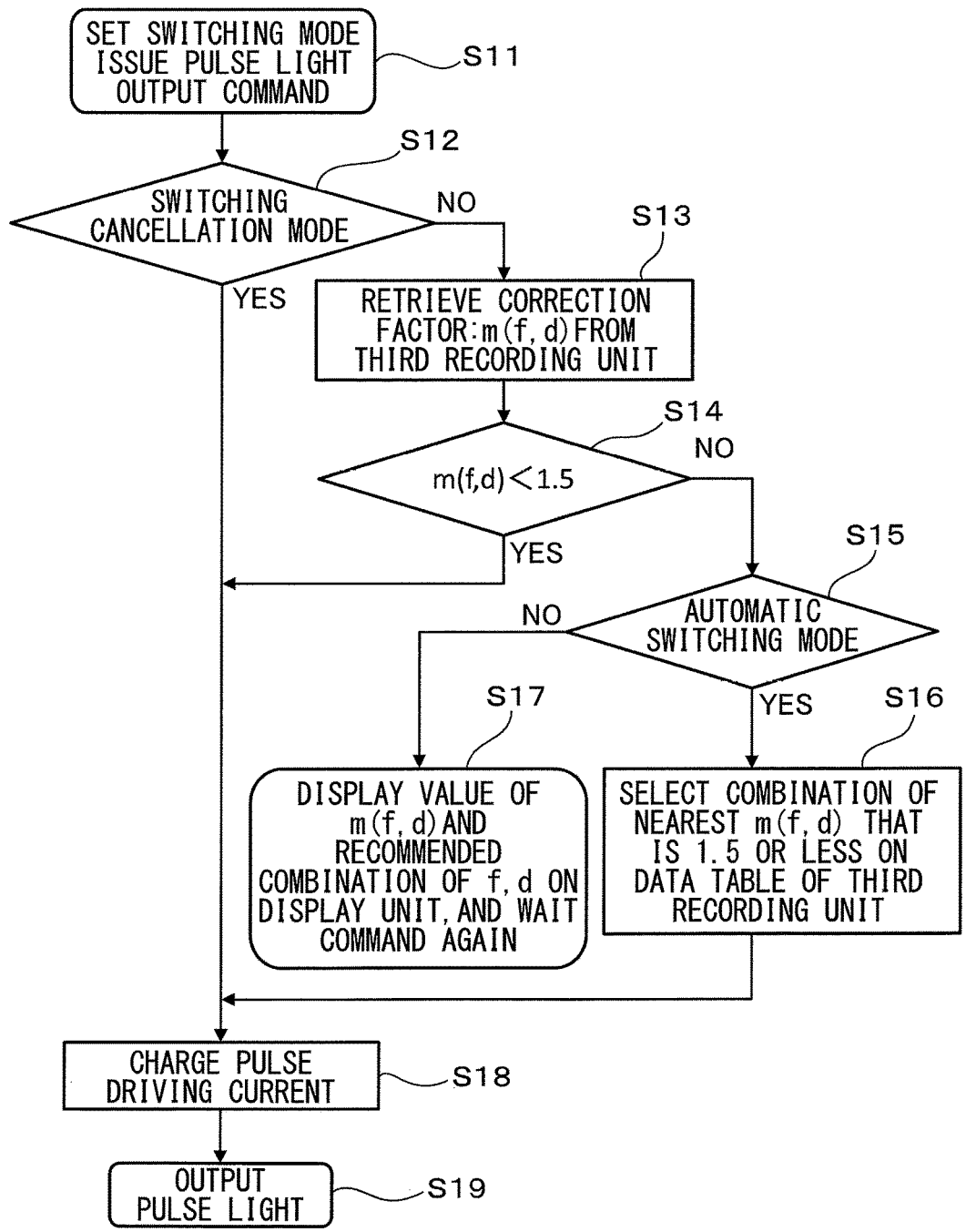
FIG. 4 is a flowchart of the operation of a laser apparatus in an embodiment based on the present invention.

FIG. 4 is a flowchart of the operation of a laser apparatus in an embodiment based on the present invention. FIG. 4 indicates a method for selecting a combination of a frequency and a duty in driving current command values forming a pulse waveform.

In step S11 in FIG. 4, a switching mode is set, driving current command values forming a pulse waveform are commanded. Further, when it is determined that mode switching is not cancelled in step S12, the process shifts to step S13.

In step S13, a correction factor m(f, d) is read out from the data table recorded in the third recording unit 10 based on frequencies and duties in driving current command values forming a pulse waveform. Then, in step S14, whether the correction factor m(f, d) is smaller than a first predetermined value, e.g., 1.5 is determined. When the correction factor is smaller than the first predetermined value, the process shifts to step S18. When the correction factor is not smaller than the first predetermined value, the process shifts to step S15.

When it is determined, in step S15, that the automatic switching mode is activated, the process shifts to step S16. In step S16, in the table of the third recording unit 10, a combination of a frequency and a duty in relation to a new correction factor which is near the location of the retrieved correction factor and which is smaller than the first predetermined value is automatically selected.

Specifically, it is preferable that, for example, only the frequency is changed to search a new correction factor. Alternatively, both the frequency and the duty, or only the duty may be changed to search a new correction factor.

Note that, when the automatic switching mode is not activated, the present correction factor and a new correction factor and their related frequency and duty are displayed on the display unit 8 (step S17). Alternatively, a predetermined alarm may be output through, for example, the display unit 8.

Subsequently, the frequency and duty are changed to the frequency and duty relating to a new correction factor in step S18, and the driving current having a pulse waveform is charged. Then, a pulse laser beam is output in step S19.

As seen above, in the embodiment shown in FIG. 4, driving current command value conditions on which a large load is applied to the life of the light source 2 can be automatically changed to driving current command value conditions on which a small load is applied to the life. This enables the life of the light source to increase.

Further, only when the automatic switching mode is selected as shown in step S15, driving current command value conditions can be automatically changed, and accordingly, this state is easily acceptable for many users. When the manual switching mode is selected, there is a possibility that, even when the correction factor m(f, d) is large to realize an excellent machining state, selection of a combination of the corresponding frequency and duty is required. Thus, as shown in step S12, switching cancellation mode can be selected. Thus, it is preferable that the driving current is charged to the light source 2 based on a combination of the commanded frequency and duty regardless of the value of the correction factor m(f, d).

In the meantime, the fourth recording unit 11 shown in FIG. 1 records a data table indicating a correlation between the first performance index which can be derived from the optical output characteristics of the light source 2 and the lifetime of the light source 2. Further, based on the data table indicating a correlation between the first performance index and the lifetime of the light source 2, the lifetime of the light source 2 when the standard driving current Is is charged is set taking the difference between the first performance indexes of the respective light sources 2 into consideration.

Figure 5:
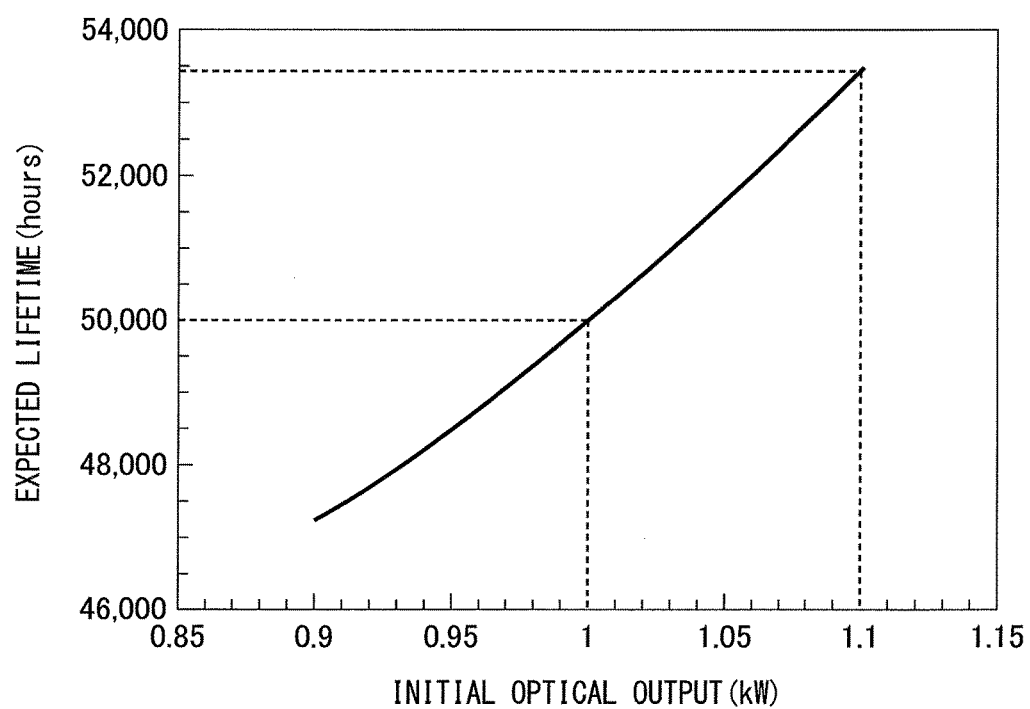
FIG. 5 is a view of the relationship between initial optical output of a light source when a standard driving current is applied and expected lifetime.

The first performance index is, for example, an initial optical output of the light source 2 when the standard driving current is charged. FIG. 5 is a view of the relationship between an initial optical output of the light source when the standard driving current is charged and an expected lifetime. As shown in FIG. 5, when the initial optical output at the standard driving current is, for example, 1 kW, the expected lifetime is approximately 50,000 hours. When the initial optical output is 1.1 kW, the expected lifetime is approximately 53,500 hours, and this new lifetime is replaced with the lifetime recorded in the first recording unit 5. The retrieval of the lifetime from the fourth recording unit 11 is performed only one time at the beginning, and accordingly, the fourth recording unit 11 is not necessarily equipped in the laser apparatus 1.

Figure 6:
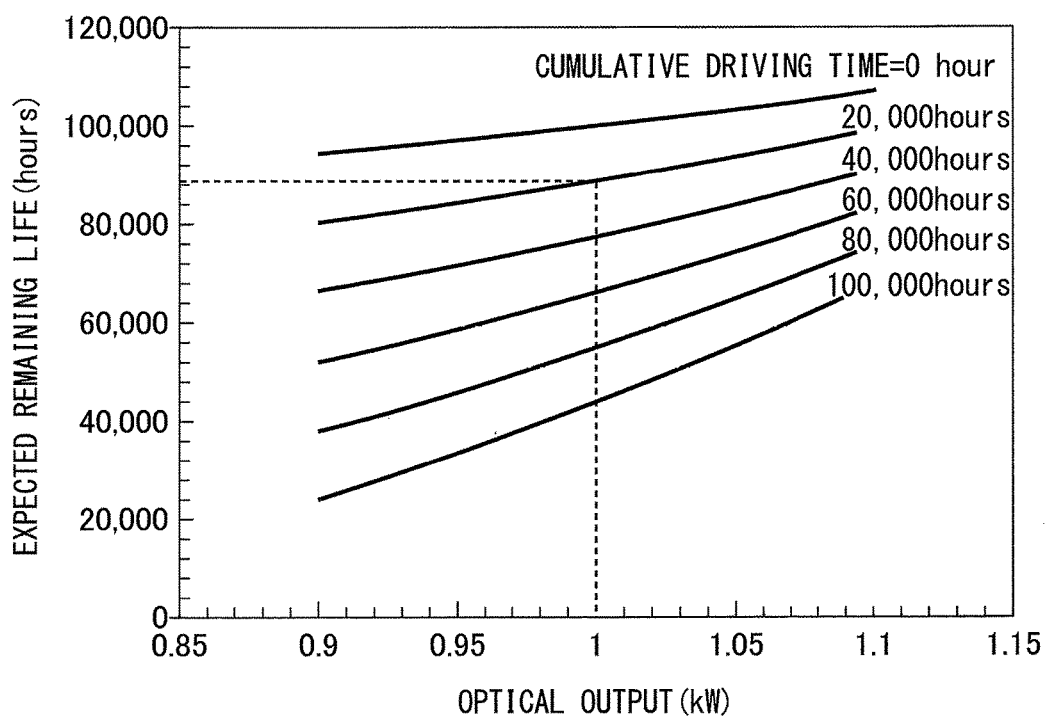
FIG. 6 is a view of the relationship between optical output of a light source when a standard driving current is applied and expected remaining life.

In the meantime, the fifth recording unit 13 shown in FIG. 1 records a data table indicating the correlation between a second performance index which can be derived from the optical output characteristics of the light source 2 and an expected remaining life. The second performance index is, for example, the optical output of the light source 2 when the standard driving current is charged. FIG. 6 is a view of the relationship between the optical output of the light source when the standard driving current is charged and the expected remaining life.

FIG. 6 indicates a plurality of solid lines. Each solid line represents a case at a different cumulative driving time at which the light source has already been driven by the standard driving current Is. As can be seem from FIG. 6, in each solid line, the expected remaining life increases as the optical output increases, and the expected remaining life reduces as the cumulative driving time increases.

A command from the control unit 4 causes the optical output detection unit 12 to measure the optical output characteristics of the light source 2 in accordance with a predetermined schedule. Then, any of the solid lines is selected from the cumulative driving time until the optical output characteristics is measured. The expected remaining life is decided based on the second performance index (optical output) derived from measurement results of the optical output characteristics and the selected solid line. In FIG. 6, the expected remaining life is referred to as a first estimated remaining life if necessary.

Suppose that, when, for example, the cumulative driving time is 20,000 hours, the optical output detected by the optical output detection unit 12 is 1 kW. In this instance, the solid line when the cumulative driving time is 20,000 hours in FIG. 6 is selected. Further, the optical output is 1 kW, and accordingly, the expected remaining life, i.e., the first estimated remaining life is approximately 88,600 hours.

Furthermore, the effective cumulative driving time is subtracted from the lifetime that has already been recorded in the first recording unit 5, to find the remaining life. When the deviation between this remaining life and the first estimated remaining life is a second predetermined value or more, a new lifetime is calculated to cause the deviation to be zero or substantially zero.

The lifetime is a sum of the cumulative driving time and the remaining life, and accordingly, the new lifetime in this case is 108,600 (=20,000+88,600) hours. Then the lifetime recorded in the first recording unit 5 is replaced with the newly calculated lifetime. The remaining life can be more accurately predicted from the optical output characteristics measured in accordance with a predetermined schedule as seen above, by performing a correction using the individual difference based on the actual deterioration state at the that time.

Note that, in the predetermined schedule, it is preferable that, for example, measurement is performed at relatively long time intervals in the early stage of life, and at relatively short time intervals in the late stage of life. In short, it is preferable the frequency of measurement increases as the remaining life reduces. This enables the remaining life to be accurately predicted. Note that the predetermined schedule may mean periodic measurements. The same is true for a predetermined schedule that will be described later.

The sixth recording unit 14 shown in FIG. 1 records the optical output characteristics of the light source 2, which is detected by the optical output detection unit 12, in association with time. The sixth recording unit 14 is only required to record the latest optical output characteristics and its measurement time point, and the measurement time point adjacent and previous to the measurement time point of the latest optical output characteristics and the optical output characteristics at that time, among optical output characteristics periodically measured by the optical output detection unit 12.

Further, the seventh recording unit 15 shown in FIG. 1 records the following effective driving time calculated by the calculation unit 6 between a third time point T3 and a fourth time point T4 after the third time point. It is preferable that the third time point T3 and the fourth time point T4 are set between the time point To and the time point Tp.

$$\text{(Effective driving time)} = \int_{T3}^{T4} k(Io(t))dt$$

Further, the eighth recording unit 16 shown in FIG. 1 records a data table of a plurality of deterioration curved lines, which indicates the progress of deterioration of the light source 2 in association with the driving time regarding the third performance index which can be derived from the optical output characteristics of the light source 2. The third performance index is, for example, a driving current for obtaining a predetermined optical output.

Figure 7:
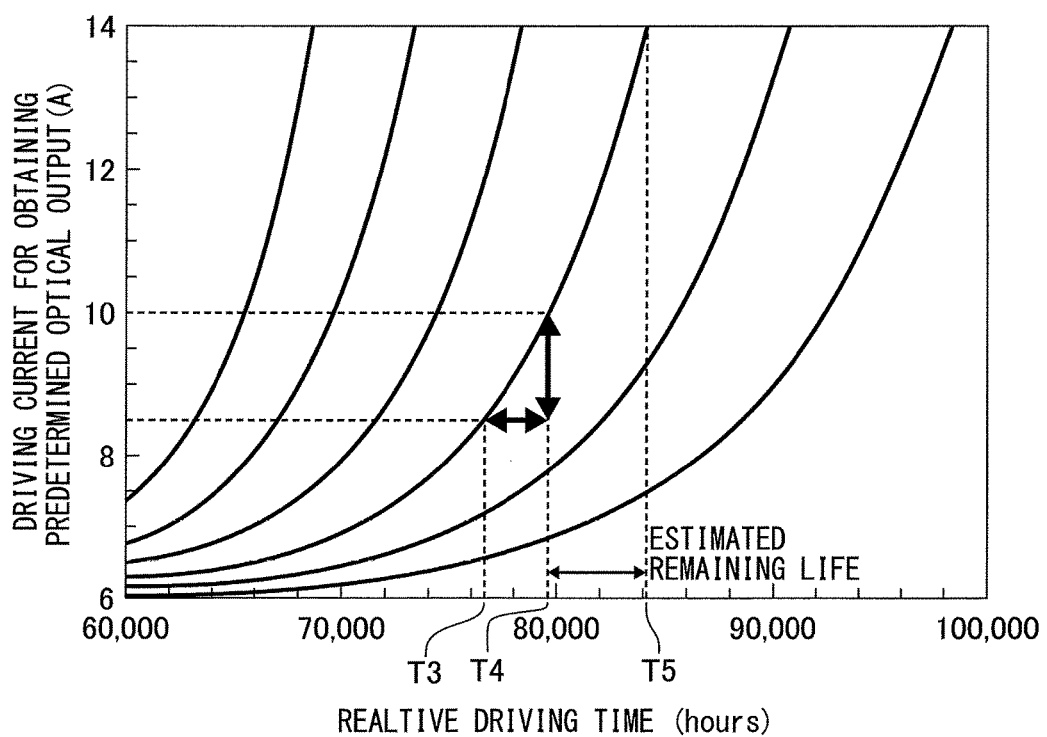
FIG. 7 is a view of the relationship between relative driving time and driving current to obtain a predetermined optical output.

FIG. 7 is a view of the relationship between relative driving time and driving current for obtaining a predetermined optical output. In an example shown in FIG. 7, the upper limit of the driving current for obtaining a predetermined optical output is set at a constant value, e.g., 14 A.

Then, a command from the control unit 4 causes the optical output characteristics of the light source 2 to be measured in accordance with a predetermined schedule. With reference to the deterioration curved lines shown in FIG. 7, the driving current value for obtaining a predetermined optical output at the time point T3 is 8.5 A, and the driving current value for obtaining a predetermined optical output at the time point T4 is 10 A. Note that, in the example shown in FIG. 7, the effective driving time between the time point T3 and the time point T4 is set to be 3,000 hours. Further, the length of an arrow extending in the Y-axis direction in FIG. 7 represents the deterioration amount of the third performance index S(T)=|S(T3)−S(T4)|=1.5 A.

In this instance, the deterioration speed of the light source 2 is obtained by dividing the deterioration amount of the third performance index S(T)=|S(T3)−S(T4)| by the effective driving time. Then the deterioration curved line, in which an inclination in the driving current value 10 A for obtaining a predetermined optical output at the time point T4 coincides with the calculated deterioration speed, is selected from FIG. 7.

Then, the remaining life of the light source 2 is estimated from a point at the time point T4 on the selected deterioration curved line. In FIG. 7, the upper limit of the driving current is set at 14 A. The remaining life can be monitored from the time point corresponding to a point at which the driving current is 14 A in the selected deterioration curved line. In FIG. 7, the time (4,600 hours) between the time point T4 (79,600 hours) and the time point T5 (84,200 hours) is an estimated remaining life (referred, if necessary, to as a second estimated remaining life).

Then, after the time point, at which the second estimated remaining life is shorter than a predetermined time, or the time point, at which the deterioration speed of the third performance index is larger than a third predetermined value, a new lifetime is calculated by adding the second estimated remaining life to the effective cumulative driving time recorded in the second recording unit 7. Then, the lifetime recorded in the first recording unit 5 is replaced with the new lifetime.

As seen above, in the late stage of life in which the deterioration in the characteristics of the light source 2 appears, the remaining life is estimated taking not only the optical output characteristics at that time but also its deterioration speed into consideration. Thus, the accuracy in prediction of the remaining life in the late stage of life, for which the accuracy in prediction of the remaining life is especially important, is further improved.

Furthermore, it is preferable that the remaining life is displayed on the display unit 8. At the time point at which the remaining life is a predetermined time or less, a command from the control unit 4 may cause a change in the display color of the remaining life and/or display of the remaining life to be blinked. Further, warning for proceeding preparation of replacement of the light source 2 may be output to the display unit 8. Further, before a warning is issued, an alarm for proceeding preparation of a light source to be replaced may be issued.

As described above, in the present invention, the accuracy in prediction of the remaining life in the late stage of life can be improved. Thus, the light source 2 can be reliably replaced before the life of the light source 2 is exhausted without the fact that the light source 2 is replaced too early. Thus, the maintenance cost can be reduced.

Further, the communication unit 17 shown in FIG. 1 can transmit, for example, measurement results of the optical output characteristics of the light source 2, the effective cumulative driving time to that time point, and the remaining life at that time point, to an external receiving unit remote from the laser apparatus 1. It is preferable that the receiving unit is connected to communication units of a plurality of laser apparatuses.

This enables information regarding data tables recorded in the fourth recording unit 11, the fifth recording unit 13, the eighth recording unit 16, etc. to be continuously collected from a plurality of laser apparatuses. Thus, the accuracy of the data tables recorded in the fourth recording unit 11, the fifth recording unit 13, the eighth recording unit 16, etc. is improved. Consequently, the accuracy in life prediction can be further improved. As seen above, the effective cumulative driving time is extremely important information. Thus, even when the remaining life is corrected based on, for example, the individual difference of the light source 2, the effective cumulative driving time is not corrected at all, and the lifetime is corrected.

Alternatively, in addition to the effective cumulative driving time and the optical output characteristics, the communication unit 17 may transmit the remaining life. In this instance, a manufacture of laser apparatuses can precisely monitor the reduction of the remaining life, and can warn a customer or can previously prepare a new light source 2 for replacement. Thus, the time, in which the laser apparatus 1 cannot be driven, can be minimized.

Further, timing for measuring the optical output characteristics of the light source 2 as well as a plurality of life confirming times may be previously set, so that the remaining life is transmitted every time when the remaining life is reduced and reaches each of a plurality of life confirming times.

Effect of the Disclosure

In the first aspect of the invention, even when the laser apparatus is used on conditions other than the standard driving current, the effective driving time, at which a load (life consumption) similar to that at the driving time when the laser apparatus is driven by the standard driving current, can be easily and accurately monitored even when the laser apparatus is in use. Further, even when the light source is driven on various optical output conditions, i.e., from a low output to a high output and from a continuous laser output to a pulse laser light output, the effective driving time can be accurately calculated.

In the second aspect of the invention, even when the laser apparatus is used on conditions other than the standard driving current, the effective cumulative driving time can be easily and accurately monitored even when the laser apparatus is in use.

In the third aspect of the invention, the life load rate can be easily found.

In the fourth aspect of the invention, the function including an exponentiated term using the values of current to the light source as variables is used to calculate the life load rate. Thus, it is only required to find only coefficients or the like necessary for the function, and it is not necessary to set the entirety of the data table of the life load rate based on, for example, experiments. Thus, man-hours for making the data table can be reduced.

In the fifth aspect of the invention, in the case of pulse driving at a high frequency, overshoot or the like may cause the waveform formed by plotting the driving current command values from the control unit to deviate from the waveform formed by plotting the driving current actual values. The magnitude of a load to the life is determined by the waveform formed by the driving current actual values, and accordingly, it is not easy to always measure the actual waveform of the driving current that changes at a high speed. In the fifth aspect of the invention, a data table of correction factors for correcting the difference between the life load rate of the waveform formed by the driving current command values and the life load rate of the waveform formed by the driving current actual values is previously set for every frequency and duty. Thus, the effective driving time can be accurately calculated from the waveform of the driving current command value without the fact that the waveform formed by the driving current actual values, which changes at a high speed, is measured.

In the sixth aspect of the invention, changing the conditions of the driving current command value, on which the load to the life is large, to the conditions of the driving current command value, on which the load to the life is small, enables the life of the light source to increase. Further, the fact that the manual switching mode and the automatic switching mode can be switched by the will of a user enables many users to accept the laser apparatus.

In the seventh aspect of the invention, the effective cumulative driving time is subtracted from the lifetime, i.e., the remaining life at the calculation starting time point of the effective cumulative driving time. Thus, an estimated remaining life with respect to an average life (average lifetime), or a life consumption rate or the like with respect to a guaranteed life on the standard driving conditions can be easily and accurately monitored even when the laser apparatus is in use.

In the eighth aspect of the invention, the lifetime is changed based on the correlation between the first performance index and the lifetime of the light source. This enables the lifetime of each light source to be set while eliminating the influence of the individual difference of the light source, to improve the accuracy in prediction of the remaining life. The first performance index is, for example, an initial optical output when the standard driving current is charged.

In the ninth aspect of the invention, instead of correction of the remaining life using the individual difference in deterioration estimated from the initial optical output characteristics of the light source, the remaining life is corrected using the individual difference based on the actual deterioration state at that time point, from the periodically measured optical output characteristics. Thus, the remaining life can be more accurately predicted. The second performance index is, for example, an optical output of the light source 2 when the standard driving current is charged.

In the tenth aspect of the invention, in the late stage of life in which deterioration in the characteristics of the light source appears, the remaining life is estimated taking not only the optical output characteristics at that time point but also its deterioration speed into consideration. Thus, in the late stage of life in which the accuracy in prediction of the remaining life is especially important, the accuracy in prediction of the remaining life can be further improved. The third performance index is, for example, a driving current for obtaining a predetermined optical output.

In the eleventh aspect of the invention, preventive maintenance can be performed before the system is failed due to the life of the light source.

In the twelfth aspect of the invention, the information regarding, for example, the data table indicating the correlation between the first performance index that can be derived from the optical output characteristics of the light source and the life of the light source, and the data table recorded in the fifth recording unit and the eighth recording unit, can be continuously collected from a plurality of laser apparatuses, and the accuracy of the data table is improved, and consequently, the accuracy in prediction of the life can be improved. Further, the reduction of the remaining life is appropriately monitored, so that it is possible to warn a customer or to previously prepare a new light source for replacement. Thus, the time, in which the laser apparatus cannot be driven, can be minimized.

The present invention has been described above using exemplary embodiments. However, a person skilled in the art would understand that the aforementioned modifications and various other modifications, omissions, and additions can be made without departing from the scope of the present invention.

What is claimed is:
1. A laser apparatus comprising:
   a light source which functions as a laser light source or an excitation light source;
   a power source which charges driving current to the light source, to drive the light source;
   a control unit for controlling the power source;
   a first recording unit for recording a life load rate of the light source indicating a ratio between a first life of the light source when driven by a first driving current, and a second life of the light source when driven by a second driving current; and
   a calculation unit which:
     calculates, as an effective driving time, a time integration of the life load rate between a first time point, at which the laser apparatus is actually driven, and a second time point after the first time point, based on a recording result of the first recording unit, and
     determines deterioration of the light source based on the effective driving time.

2. The laser apparatus according to claim 1, comprising a second recording unit which records, as an effective cumulative driving time, a time integration of the life load rate between a starting time point of the use of the light source and the present time point.

3. The laser apparatus according to claim 1,
wherein the life load rate is a ratio between the life of the light source when standard driving current is charged to the light source and the life of the light source when driving current is charged to the light source.

4. The laser apparatus according to claim 1,
wherein the life load rate is a function including an exponentiated term of a ratio between standard driving current charged to the light source and driving current charged to the light source.

5. The laser apparatus according to claim 3, comprising a third recording unit which records, when a command value of driving current having a pulse waveform is input, a correction factor using frequency and duty in the pulse waveform as variables, in relation to a ratio between a time integration of the life load rate calculated based on a command value of the driving current and a time integration of the life load rate calculated based on an actual value of the driving current, wherein
the calculation unit calculates a time integration of the life load rate between the first time point and the second time point based on a command value of the driving current, and the correction factor.

6. The laser apparatus according to claim 5, wherein, when the correction factor is larger than a first predetermined value, indication or warning of the fact that a change of command value of the driving current is suggested is output, or a combination of the frequency and the duty is changed so that the correction factor is smaller than the first predetermined value.

7. The laser apparatus according to claim 2, wherein the first recording unit further records, as a lifetime, the life of the light source when standard driving current is charged to the light source, and further calculates a remaining life by subtracting the effective cumulative driving time from the lifetime.

8. The laser apparatus according to claim 7, further comprising a fourth recording unit which records a correlation between a first performance index that can be derived from the optical output characteristics of the light source and the lifetime of the light source, wherein the lifetime of the light source is changed based on the correlation recorded in the fourth recording unit.

9. The laser apparatus according to claim 2, further comprising:
an optical output detection unit for measuring an optical output characteristics of the light source; and
a fifth recording unit which records a correlation between a second performance index, which can be derived from the light output characteristics of the light source after the optical source is driven, by only a cumulative driving time, at the standard driving current, and an expected remaining life of the light source, wherein
a command from the control unit causes a first estimated remaining life to be estimated based on the second performance index derived from a measurement result obtained by measuring an optical output characteristics of the light source in accordance with a predetermined schedule, an effective cumulative driving time until the optical output characteristics is measured, and a record result recorded in the fifth recording unit, and
when a deviation between the first estimated remaining life and a remaining life obtained by subtracting the effective cumulative driving time from the lifetime of the light source, which is recorded in the first recording unit until the optical output characteristics of the light source is measured, is not less than a second predetermined value, the lifetime is changed so that the deviation is zero or substantially zero.

10. The laser apparatus according to claim 2, comprising:
an optical output detection unit for measuring an optical output characteristics of the light source;
a sixth recording unit which records the optical output characteristics detected by the optical output detection unit in association with time;
a seventh recording unit which records an effective driving time between a third time point and a fourth time point after the third time point, calculated by the calculation unit based on a recording result of the sixth recording unit; and
an eighth recording unit which records a data table of a deterioration curved line representing the progress of deterioration in association with the driving time regarding a third performance index that can be derived from an optical output characteristics of the light source, wherein
a command from the control unit causes a second estimated remaining life to be estimated by checking, when an optical output characteristics of the light source is measured in accordance with a predetermined schedule, a deterioration speed of the third performance index, which is obtained by dividing a deviation between the third performance index at the third time point and the third performance index at the fourth time point by the effective driving time, against the deterioration curved line recorded in the eighth recording unit, and
after a time point at which the second estimated remaining life is shorter than a predetermined time, or a time point at which a deterioration speed of the third performance index is larger than a third predetermined value, the lifetime of the light source, which is recorded in the first recording unit at the fourth time point, is changed to a sum of the effective cumulative driving time recorded in the second recording unit and the second estimated remaining life.

11. The laser apparatus according to claim 7, wherein, when the remaining life, which is obtained by subtracting the effective cumulative driving time from the lifetime, is not greater than a predetermined time, at least one of changing a color of the remaining life displayed on a display unit and blinking the remaining life displayed on the display unit is performed.

12. The laser apparatus according to claim 2, comprising:
an optical output detection unit for measuring an optical output characteristics of the light source; and
a communication unit which transmits the optical output characteristics, the effective cumulative driving time until the optical output characteristics is measured, and the remaining life when the optical output characteristics is measured, to the outside, wherein
a command from the control unit causes the transmission unit to transmit, when an optical output characteristics of the light source is measured in accordance with a predetermined schedule, a measurement result of the optical output characteristics of the light source, the effective driving time until that time point, and the remaining life, to a receiving unit provided at a location remote from the laser apparatus, via the communication unit.

* * * * *